United States Patent [19]

Rossman

[11] Patent Number: 4,710,346
[45] Date of Patent: Dec. 1, 1987

[54] METHOD FOR MANUFACTURING POWDER MATERIAL AND SHAPED PRODUCTS UTILIZING THE CONDITIONS IN OUTER SPACE

[75] Inventor: Axel Rossman, Karlsfeld, Fed. Rep. of Germany

[73] Assignee: Motoren-und Turbinen-Union München, GmbH, Munich, Fed. Rep. of Germany

[21] Appl. No.: 689,839

[22] Filed: Jan. 9, 1985

[30] Foreign Application Priority Data

Jan. 19, 1984 [DE] Fed. Rep. of Germany ....... 3401700

[51] Int. Cl.$^4$ .............................................. B22F 33/02
[52] U.S. Cl. .................................. 419/68; 75/0.5 AA; 75/0.5 AB; 75/0.5 AC
[58] Field of Search .................... 428/546; 75/0.5, 251, 75/228; 204/192; 65/152, 157, 153; 264/81, 85, 101, 109; 425/405 R, 405 H, DIG. 60; 239/79; 164/46; 419/60, 61, 68, 66, 1, 10, 42, 49

[56] References Cited

U.S. PATENT DOCUMENTS 4,168,182 9/1979 Rossman et al. .................... 148/3
4,418,124 11/1983 Jackson et al. ..................... 428/548
4,480,617 11/1984 Henson et al. ...................... 164/46
4,515,684 5/1985 Singer .................................. 428/546

OTHER PUBLICATIONS

"Shuttle 7 to Carry Multinational Payload", *Aviation Week & Space Technology*, Covault, 5-1983.

*Primary Examiner*—Deborah L. Kyle
*Assistant Examiner*—T. J. Wallen
*Attorney, Agent, or Firm*—Roberts, Spiecens & Cohen

[57] ABSTRACT

A method and apparatus for manufacturing powders comprising converting a solid starting material from the solid state to the gaseous or vapor phase, and forming powder particles by transferring the starting material in gaseous or vapor phase into a sealed reaction chamber with nucleation agents. The reaction chamber includes a wall of bellows construction to enable the chamber to expand and contract and a radiation reflecting coating is provided on at least a portion of the wall. The reaction chamber is subjected to one or more conditions of outer space. The powder particles can be supplied to a shaping stage in which the powder particles are compressed into compacts or formed into the final shape of a desired component.

16 Claims, 10 Drawing Figures

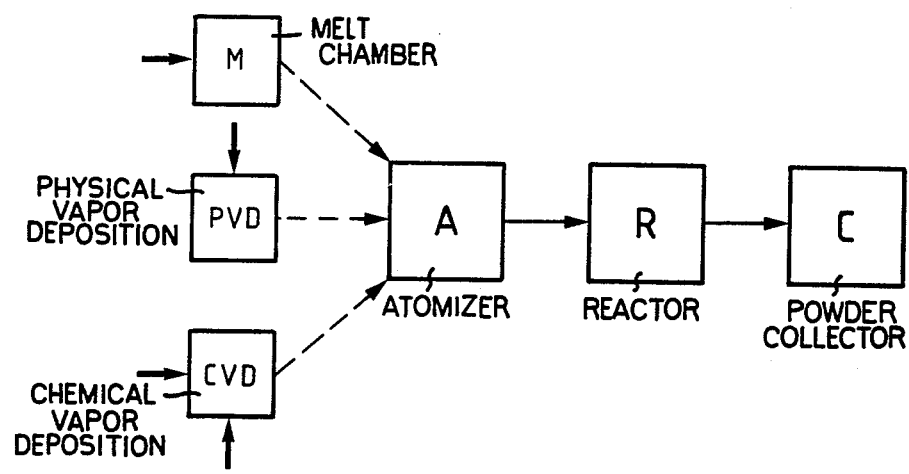
Fig. 1
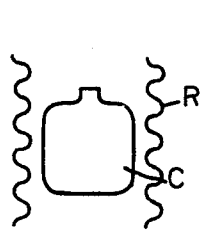 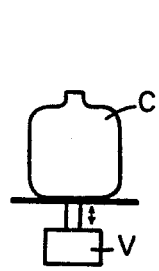 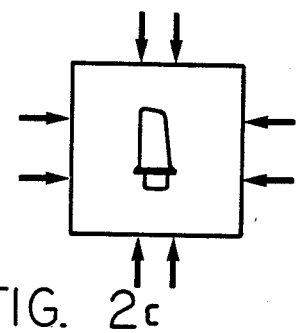
FIG. 2a  FIG. 2b  FIG. 2c

METHOD FOR MANUFACTURING POWDER MATERIAL AND SHAPED PRODUCTS UTILIZING THE CONDITIONS IN OUTER SPACE

FIELD OF THE INVENTION

The invention relates to methods for forming powders and shaped products therefrom and to the resulting powder and shaped product.

BACKGROUND

In a great number of engineering fields, high-grade metallic and non-metallic components i.e., compacts are manufactured from powders. For this purpose, powder starting materials of metals and/or metalloids are subjected to treatments such as heat and pressure to convert the powder materials into compacts substantially corresponding to the final shape of the components. The treatment and shaping processes may be conducted in a single stage or in multiple stages.

The properties of the components or compacts made from powders vary mainly according to the properties of the powder. Namely:

Surface layers on the power particles affect the sintering performance and the material properties that are influenced by the particle boundary;
Segregations in the powder particles affect the strength or the cracking tendency;
Gaseous inclusions in the powder particles affect the gas content and porosity of the finished part.

Further properties of the components or compacts made from powders, such as the physical, electrical, chemical and thermal properties, likewise vary according to the properties of the powder, so that a compact made of spherical powder particles (prior to heat treatment, such as sintering), normally exhibits poor shape stability, which makes it difficult to handle these green compacts. Spattered or dendritic powder will normally greatly reduce the strength of the green compact.

The powder is manufactured by various methods. These include primarily spraying, liquefying or atomizing metallic materials at temperatures above the melting point. This produces spherical or spattered powder, depending on whether the metal droplets were developed before or after contact with solid surfaces.

The manufacture of powder from the vapor phase by chemical vapor deposition (CVD) or physical vapor deposition (PVD) is known for the manufacture of non-spherical powders. The manufacture of powder in a floating condition, without the particles building up on stationary surfaces, has its limitations under gravitation conditions. These are imposed by the difficulty of admitting the gas required for flotation or by the limited spatial extent of the reaction (vacuum) vessels.

One great problem in the known process is in adding sintering promoting materials into the powder. These materials should be as uniformly distributed as possible and should be used as sparingly as possible. Accumulations of sintering promoting materials can cause differences in density, distortion, local stress and ductility losses, and the like in the finished product.

SUMMARY OF THE INVENTION

An object of the present invention is to provide a method for manufacturing high-purity powders of selective, uniform geometry, especially of dendritic or snow-flake structures with controlled distribution of the components. Powders of this description enable the manufacture of compacts and components of improved properties for many engineering applications under conditions, that on earth, with its gravitational field (macrogravitation) can be realized only with extreme effort.

A more particle object of the present invention is to provide methods for manufacturing powders, composite powders or composite materials and its treatment and shaping under conditions in outer space especially that of zero gravity (microgravitation). The other conditions in outer space, such as vacuum, low temperatures and radiation can be additionally utilized.

The invention is also directed to the use of composite materials or compacts or components so manufactured. Compacts as used within the contemplation of the present invention also include stock material, such as blanks or preforms whereas components signify items of substantially final shape.

The invention is also directed to apparatus for carrying out the methods of processing powder particles under conditions in outer space.

The major advantages provided by the present invention are, amongst others, that under conditions in outer space, especially weightlessness, the crystal nuclei are maintained in flotation condition without requiring controlled admission of gas such as argon as on Earth. This readily permits particles to build-up all around their core. Relatively long flotation times and, thus, slow separation times, permit the formation of special structures i.e., particle shapes and achieving special shaping such as crystal prisms. For improved properties, laminar structures composed of various components can be manufactured.

If suitable crystal nuclei, such as ceramic particles are used, powders can be manufactured that permit the manufacture of dispersion-hardened metallic materials. With ceramic materials, for example, this will permit the creation of pseudo-ductile properties i.e., microcracking by using properties of controlled differences such as thermal expansion, elasticity, and strength between the powder envelope and the core.

The deposition of especially readily sinterable materials or material phases on the particle surface will appreciably improve its sinterability and other properties. Typical examples follow hereafter:

a. For ceramic materials SiC core; envelope of carbon+borium $Si_3N_4$ core; envelope of sintering promoting material such as yttrium oxide
b. For metals Deposit borium of lower melting point on powder surface to make it possible to use liquid phase sintering
c. For glass (metalliferous) Add metalloids such as borium to raise the crystallization temperature.

Brief fusion of the resultant powder particles at the end of the manufacturing process permits the form of the core to be selectively affected. By way of example in an extreme case, a snow-flake shaped component may be turned into a spherical one. Subsequent heat treatment in the floating condition will then operate to balance components. Suitable sources of heat are, for example, electric arc, laser, electron beam and focussed light beams.

Due to the extremely low, i.e., near absolute zero (0° K.), temperatures in outer space, fused or heated particles can be rapidly cooled, for example, by contact with cold surfaces or by heat transfer. This permits the manufacture of spherical structures such as metallic glass and surface conditions such as high-energy surfaces of especially desirable reactivity and sintering properties.

High-strength, especially tensile strength, glass having a hypoeutectic metalloid content can be manufactured in this manner. Their strength will be due especially to a favorable microstructure. Apart from mechanical properties, chemical properties, such as resistance to corrosion and biocompatibility, can also be improved. Desirable magnetic and electrical properties can also be produced. The method of material manufacture of the present invention offers a wide range of new potential applications.

Due to conditions of outer space the apparatus required for manufacture is rather simple and is not subject to the spatial limitation of reaction vessels, as are vacuum vessels on Earth. No special cooling devices are required, not even in the compaction or quenching of the powder. Degassing is not required. No undesirable segregations or surface skins will develop on the powder particles.

The reaction vessel used in the apparatus can be very lightweight and, for example, is of bellows construction. Communicating with this reaction vessel may be conventional melting and/or gasifying or vaporizing devices. Also connected to the reaction vessel may be powder collecting vessels. If upon completion of powderization, the obtained powder requires handling, especially when removing it from the reaction chamber, mechanical conveyors, such as oscillating devices, plungers or screws can be used as well as electrical, acoustical and magnetic fields. The obtained powder can be delivered to processing stations at which shaping and component manufacture can advantageously directly follow the powder manufacture both in terms of process and equipment.

BRIEF DESCRIPTION OF THE FIGURES OF THE DRAWING

Further objects and features of the present invention will become apparent from the following detailed description of embodiments illustrated in the drawing in which FIG. 1 is a schematic arrangement illustrating the process sequence according to the invention where individual process stages may be performed alternatively, or may be complemented or combined, depending on the powder and the desired manufacturing process;

FIG. 2a diagrammatically illustrates a post-treatment station for the manufactured powder;

FIG. 2b diagrammatically illustrates a station for preforming or enveloping the powder particles;

FIG. 2c diagrammatically illustrates a station for shaping a component;

DETAILED DESCRIPTION OF PREFERRED EMBODIMENTS

With reference to FIG. 1 therein is illustrated the method of the present invention for the manufacture of powders from metallic and/or non-metallic starting materials which proceeds from left to right in a series of process steps.

The starting materials are normally in solid form and include metals, metal alloys, compounds, and combinations such as: metal-ceramic, metal-glass (also called amorphous metals), ceramic-metal (cermets) and ceramic-glass (glass ceramics).

The starting material, if in solid form, is first melted in chamber M by means of an external source of heat, such as an electron beam, plasma energy, laser beam, electric arc, electromagnetic waves, and the like to be described later with reference to FIG. 4 or in an induction furnace to be described later with reference to FIG. 5. In the process, a melt is produced in a crucible or preferably without a crucible using one of the conventional methods that are listed in Table I and that are commonly collectively referred to as physical vapor deposition (PVD) methods. Instead of physical vapor deposition, chemical vapor deposition, (CVD) methods can be used, particularly when it is intended to combine two or more components. In a particular aspect of the present invention the starting material, for the CVD method may be a gas mixture, so that the introductory melting step of the process can be eliminated. During the melting stage, minute droplets are produced by rotational distribution, soluble gas processes or by other known processes and the droplets are distributed, together with nucleation agents of similar or dissimilar materials, in a reaction chamber. This chamber is subjected to the conditions of outer space especially zero gravity or weightlessness, whereby advantages of pulverization in a floating, weightless state are obtained, such as spraying, atomizing or other distribution or disintegration of the starting material to form powder in the distributor or atomizer A of FIG. 1. In order to achieve the conditions in outer space, the method can actually be carried out in outer space. By "outer space" is meant that region beyond the Earth where zero gravity, substantially absolute zero temperature and substantially absolute vacuum prevail.

Figure 3A:
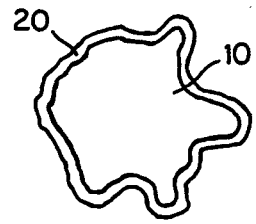
FIG. 3a diagrammatically illustrates spattered powder, in which the particle core is enveloped.

The powder is then supplied to an expandable reactor R to be formed into the desired shape and composition, preferably the spattered, enveloped-core shape as seen in FIG. 3a where the core 10 is seen with an envelope 20. The reactor R is cooled preferably by being exposed, at least in part, to conditions of outer space, which is at a temperature near absolute zero. Cooling is preferably carried out to special advantage at the lower region of the reactor, where it is connected to a powder collector C. This permits favorable, rapid cooling (quenching) without the need for separate equipment for the purpose.

The wall of the reaction chamber R is preferably made expandable such as by being formed as bellows which can be provided, at least in part, with a coating on its surface that reflects outside radiation. Conceivably, however, a portion of the bellows can be made permeable, especially to solar and/or electromagnetic space wave radiation, or if desired, such permeable portions can be alternately arranged with impermeable portions.

TABLE I

| Powder Manufacturing Processes | | | | |
|---|---|---|---|---|
| Fusion | | | | |
| EB | Plasma | Electr. arc | EMW | Distribution |
| PSV | PREP | REP | PSV | |
| | | DEP | | |
| | | CLET | | |
| EBRD | PREP | CSC | EMRD | Droplets |
| | | | | Double-stage |
| EBRD | | | EMRD | Flow |
| | | | | US ultrasonic |
| | | | | EM electromagn. |

As seen in FIG. 2a the powder is collected in a vessel C, which can be detached from the reactor and the powder is subsequently conditioned or heat treated.

FIG. 2b diagrammatically illustrates the precompacting or preforming of the powder, which if desirable can be enveloped by a layer. This envelope need not necessarily be impermeable to gas, as in conventional processes, and addtionally, stress relieving, which is required in current state-of-the-art processes, can be omitted.

Figure 3B:
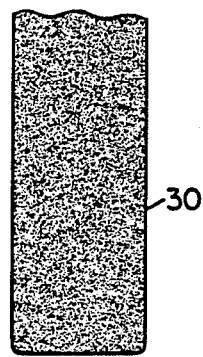
FIG. 3b illustrates a preform.
Figure 3C:
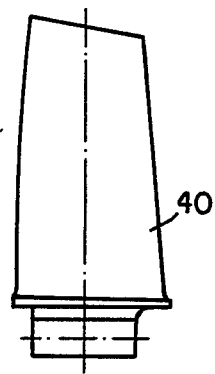
FIG. 3c diagrammatically illustrates a finished component.

FIG. 2c diagrammatically shows a molding step of the process, preferably a hot isostatic pressurization (HIP), to form a preform 30, such as shown in FIG. 3b or a component 40 of substantially final shape as shown in FIG. 3c. The preforming or precompacting of the powder can be effected with vibration of the collector C as diagrammatically illustrated by the arrows in FIG. 2b under the action of vibrator V. The hot isostatic pressurization method is optimally suited for pressing most powders optionally using an envelope or can. Often used in combination with the HIP method is sintering. The inventive concept, however, also embraces shaping methods other than HIP.

Figure 4:
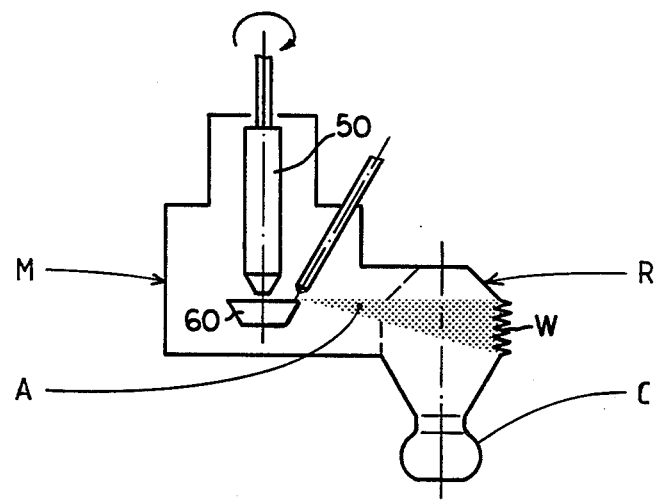
FIG. 4 diagrammatically illustrates apparatus for manufacturing powder in which steam is generated physically, and including a chamber in which powder is produced and immediately connected thereto is a collapsible reaction chamber and a powder collector.

In FIG. 4 is seen an apparatus comprising a melting chamber M, a reactor R and a powder collector C into which the melt is distributed after evaporation by the PVD process using suitable energy, such as electron energy, plasma energy or a laser gun. However, another source of heat can be an electric arc or electromagnetic waves or a highly focused light beam from space. The reactor R has a wall W which is collapsible and extendable, for example by being formed as a bellows, and the reactor is arranged for each mechanical coupling and decoupling with the powder collector C. The melting chamber M includes a rotating electrode 50 and crucible 60.

Figure 5:
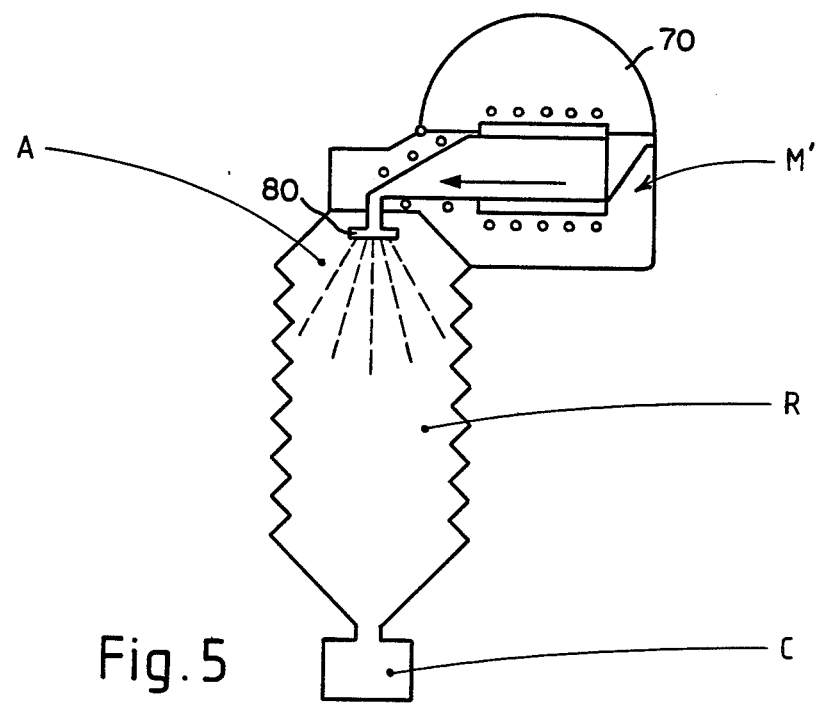
FIG. 5 diagrammatically illustrates an embodiment of the apparatus, where downstream of the melt chamber, minute melted droplets are atomized into the collapsible reaction chamber and powder collector.

FIG. 5 shows a modified embodiment of the apparatus in which melt chamber M' has a cover 70 which is removable and comprises an evacuable furnace, particularly a multizone furnace that is gradually inductively heated externally. The melt is then conveyed by electrical, mechanical, hydraulic or pneumatic means to a nozzle 80 for mechanical distribution, such as spraying, spinning or similar forms of atomization to be formed into minute melted droplets or other material particles.

Figure 6:
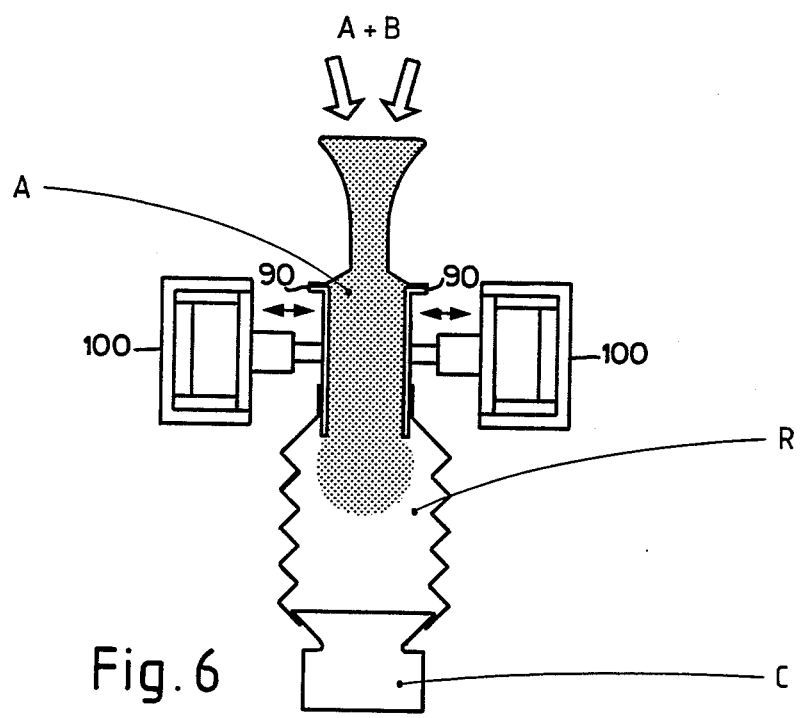
FIG. 6 diagrammatically illustrates an embodiment for carrying out chemical gas phase-phase separation of two or more reactants and their transfer into the collapsible reaction chamber and the powder collector connected thereto.

Diagrammatically illustrated in FIG. 6 is a modified apparatus for powder manufacture using the CVD process, where two or more components, for example, A and B are combined into a single stream that is subjected to an acoustic field set up between vertically arranged ultrasonic resonator disks 90 and where the particles do not come into contact with the disks. The ultra-sound is generated by two piezovibrators 100 arranged at the left and right of the resonator disks, using a stepped transformer. An electromagnetic field can be generated instead of the ultrasonic field. The powder is treated in reactor R and collector C in substantially the same manner as in the embodiments of FIGS. 4 and 5.

Of the many potential applications of the invention, several typical examples are listed in Table II below. These applications will be found in mechanical, automotive, aerospace, defense and marine engineering, as well as in medical, electrotechnical, chemical, reactor and high-temperature engineering.

TABLE II

| COMPOSITE | POWDER | PARTS APPLICATION | |
|---|---|---|---|
| Metals: | Al, Ti, Cu, Cr, Fe, Co, Ni, Mo, W, Re, Bi | Semiconductors | |
| (& alloys) | Ta, Nb, V, Pb, Sn, Ge, Th, Hf, Be, Zr, Si | Electrodes | |
| | U, Pt group metals, rare earth metals | Targets | |
| | Superalloys, Ni-base alloys, steel alloys, Ti-base alloys | Turbine components | |
| | ferrite, HSS, stellite | Compressors | |
| | | Pumps | |
| CERAMICS | $Al_2O_3$—TiC, Cr—$Al_2O_3$, Mo—Cr—SiC | Beams | Laminates |
| | Mo—Cr—$Al_2O_3$, $Al_2TiO_5$ | | |
| | OXIDES e.g. $Al_2O_3$, $ZrO_2$, BeO, $ThO_2$, $SiO_2$, $UO_2$ | Pipes, vessels, etc. | Anti-erosion |
| | CARBIDES e.g. TiC, SiC, $B_4C$, WC, TaC, ZrC, VC | chem. & nuclear | heat |
| | MoC, NbC, CrC | reactor parts, tools | corrosion |
| | NITRIDES e.g. $Si_3N_4$, TiN, ZrN, BN, TaN, VN, AlN | Rocket components, etc | wear |
| | | Bearing components | coating |
| | | Brazing and welding aids | |
| GLASS | BORIDES e.g. $TiB_2$, $ZrB_2$, $TaB_2$, $Mo_2B_5$, $W_2B_5$, | Piezo-elements | |
| | FeB, NiB | Implants | |
| | SILICIDES $TiSi_2$, $ZrSi_2$, $TaSi_2$, $MoSi_2$, $WSi_2$ | Acoustic and tube parts | |
| | on Fe, Ni, Co, Cr, Mo, W-base MgO, SiO, $SiO_2$ | Lamp parts | |
| | with B, P, C, Si | Magnets, windows | |
| | | Mirrors | |

While the invention has been disclosed in relation to specific embodiments, it will become apparent to those skilled in the art that numerous modifications and variations can be made within the scope and spirit of the invention as defined in the attached claims.

What is claimed is:

1. A method for manufacturing powders comprising converting a solid starting material from the solid state to the gaseous or vapor phase, and forming powder particles by introducing the starting material in gaseous or vapor phase through an inlet into a sealed chamber and subjecting said chamber and the material therein to substantially zero gravity such that the crystal nuclei of the starting material become formed into the powder particles in flotation condition in said chamber, expanding or contracting said sealed chamber while the material is subjected to zero gravity and reflecting radiation into the chamber from a radiation reflecting coating in a portion of the wall of the chamber.

2. A method as claimed in claim 1 wherein the powder particles which are formed are composites combined from a plurality of starting materials.

3. A method as claimed in claim 2 comprising shaping the powder particles to a desired shape by compaction following particle formation.

4. A method as claimed in claim 1 wherein the solid starting material is converted to gaseous or vapor phase by chemical or physical vapor deposition.

5. A method as claimed in claim 1 wherein the method is carried out in outer space.

6. A method as claimed in claim 1 wherein the starting material in gaseous or vapor phase is introduced into the sealed chamber with nucleation agents.

7. The product obtained by the method of claim 1.

8. A method as claimed in claim 1 wherein the condition of zero gravity is achieved in outer space.

9. A method as claimed in claim 8 wherein said chamber is subjected to outer space conditions of absolute zero temperature, and vacuum.

10. A method as claimed in claim 8 in which a plurality of starting materials are introduced into the sealed chamber to obtain a composite material which is then formed into a shaped product by powder metallurgy carried out under conditions of outer space.

11. A method as claimed in claim 1 wherein said crystal nuclei and the powder particles formed therefrom are maintained in said flotation condition without admission of gas into said chamber.

12. A method as claimed in claim 1 comprising heat treating said powder particles in flotation condition in said chamber at substantially zero gravity.

13. A method as claimed in claim 1 comprising collecting said powder particles from said chamber.

14. A method as claimed in claim 1 wherein said starting material is sprayed into said chamber.

15. A method for manufacturing powders comprising converting a solid starting material from the solid state to the gaseous or vapor phase, and forming powder particles by introducing the starting material in gaseous or vapor phase through an inlet into a sealed chamber and subjecting said chamber and the material therein to a vacuum and to substantially zero gravity such that crystal nuclei of the starting material become formed into the powder particles in flotation condition in said chamber, collecting said powder particles at an outlet of said sealed chamber into a collector which is at the same vacuum as the sealed chamber, cooling the powder particles at least in the region of said chamber where the particles pass from the chamber to the collector and forming said region with a radiation reflective coating on at least a part of the wall thereof.

16. A method as claimed in claim 15 comprising compacting the powder particles from the collector to form a shaped product by powder metallurgy carried out under conditions of outer space.

* * * * *